United States Patent [19]

Ziegler et al.

[11] 3,954,572
[45] May 4, 1976

[54] METHOD OF MANUFACTURING AN INTERMETALLIC SUPERCONDUCTOR

[75] Inventors: Günther Ziegler, Erlangen; Peter Lanig, Erlangen-Bruck; Erwin Schmidt, Erlangen; Sigrun Frohmader, Erlangen, all of Germany

[73] Assignee: Siemens AG, Munich, Germany

[22] Filed: June 5, 1974

[21] Appl. No.: 476,449

[30] Foreign Application Priority Data
July 3, 1973 Germany.......................... 2333893

[52] U.S. Cl. ............................... 204/37 T; 29/599; 174/126 CP
[51] Int. Cl.² .................. C25D 5/50; H01V 11/00
[58] Field of Search ...................... 204/37 T, 37 R; 174/DIG. 6, 126 CP; 29/599

[56] References Cited
UNITED STATES PATENTS

| | | | |
|---|---|---|---|
| 3,625,662 | 12/1971 | Roberts et al. | 335/216 |
| 3,728,165 | 4/1973 | Howlett | 174/DIG. 6 |
| 3,731,374 | 5/1973 | Suenaga | 29/599 |
| 3,778,894 | 12/1973 | Kono | 174/126 CP |
| 3,829,963 | 8/1974 | McDougall | 148/127 |
| 3,838,503 | 10/1974 | Suenaga | 174/126 CP |

*Primary Examiner*—T. M. Tufariello
*Attorney, Agent, or Firm*—Kenyon & Kenyon Reilly Carr & Chapin

[57] ABSTRACT

A method for the manufacture of a superconductor having a superconductive intermetallic compound consisting of at least two elements in which at least one core containing at least one ductile element of the compound is surrounded by a jacket of ductile matrix material, after which the structure so obtained is subjected to a cross section-reducing process and the remaining elements of the compound subsequently applied to the jacket of matrix material followed by a heat treatment performed in a manner such that the compound is formed through a reaction of the remaining elements with the core after diffusion through the matrix material. The remaining elements are applied as a sheath of an alloy containing these elements along with a carrier metal which is deposited on the jacket of the matrix material after the last cross section-reducing process step and before heat treatment for forming the compound.

17 Claims, 5 Drawing Figures

U.S. Patent    May 4, 1976    3,954,572

METHOD OF MANUFACTURING AN INTERMETALLIC SUPERCONDUCTOR

BACKGROUND OF THE INVENTION

This invention relates to superconductors of the type including a superconductive intermetallic compound consisting of at least two elements in general, and more particularly to an improved method for manufacturing such a superconductor.

Intermetallic superconducting compounds consisting of two elements of the type $A_3B$, for example, $Nb_3Sn$ or $V_3Ga$, and having an A-15 crystal structure are known to have very good superconductive properties and are distinguished in particular by a high critical magnetic field, a high transition temperature and a high critical current density. As a result, compounds of this nature are particularly well suited for superconducting coils used for generating strong magnetic fields such as those used for example, for research purposes. In addition, such coils find application in the superconducting magnets used in the suspended guidance of magnetic suspension railroads or in the windings of electric machines. More recently, ternary compounds such as, niobium-aluminum-germanium ($Nb_3Al_{0.8}Ge_{0.2}$) have become of particular interest. However, since these compounds are very brittle, considerable difficulty is encountered in their manufacture into a form suitable for use in magnet coils or the like.

Several methods have been developed, making possible the manufacture of superconductors with, in particular, two-component intermetallic compounds in the form of long wires or ribbons at low diffusion temperatures. These methods which are particularly applicable to the manufacture of multi-core conductors using wires of $Nb_3Sn$ and $V_3Ga$, embedded in a normal conducting matrix, are carried out by surrounding a ductile element of the compound to be produced in wire form, such as a niobium or vanadium wire in a sheath of an alloy containing a ductile carrier metal and other elements of the compound, e.g., a copper-tin alloy or a copper-gallium alloy. In particular, multiplicity of such wires can be embedded in a matrix of the alloy. The structure so obtained is then subjected to a cross section reducing process. This results, on one hand, in a long wire such as that required by coils, and on the other hand, the reduction of the diameter of the wire which is, for example, niobium or vanadium to a low size in the order of about 30 to 50 $\mu m$. This is desirable in view of the superconductive properties of the conductor. In addition, the cross section reducing process obtains the best possible metallurgical bond between the wire and the surrounding jacket material of the alloy, without the occurance of reactions that lead to an embrittlement of the conductor. After the cross section-reducing process, the conductor, which consists of one or more wires and the surrounding matrix material, is subjected to heat treatment in such a manner that the desired compound is formed through the reaction of the wire material such as niobium or vanadium with the additional element of the compound contained in the surrounding matrix. This additional material would be for example, tin or gallium. During this process, the element contained in the matrix diffuses into the wire material and reacts with the latter forming a layer consisting of the desired compound. Processes of this nature are disclosed in German Offenlegungsschrift No. 2,044,660 German Offenlegungsschrift No. 2,052,323, and German Offenlegungsschrift 2,105,828.

In these prior art methods, wires consisting of one element of the compound to be produced such as niobium or vanadium, are embedded in the matrix material of an alloy containing a ductile carrier metal and the other elements of the compound, and are then deformed together with the matrix material. The matrix material, however, hardens very quickly during cross section-reducing cold-working and can then be deformed further only with great difficulty. Thus, in carrying out these prior art methods, it is necessary to anneal the conductor structure consisting of the wires and the matrix material relatively frequently during the cross section-reducing processing in order to heal the lattice dislocations produced in the matrix material. Although such annealing treatments can be carried out at temperatures and annealing times, which will not as a rule cause the superconductive compound to be produced, they are very time-consuming, particularly because of their frequent repetition. Because of this, various processes have been proposed in which the repeated annealing is avoided. In these processes, one or more cores of one ductile element of the compound to be produced, e.g., niobium or vanadium are embedded in a ductile matrix material such as copper, silver or nickel which does not contain an element of the compound to be produced. The resulting structure is then processed and does not require any intermediate annealing during the cross section reducing process. Thus, it can be drawn down very quickly into a fine wire containing very fine cores of vanadium or niobium using cold-drawing processes. After the last cross section reducing process step, the remaining elements of the compound to be produced, i.e., tin in the case of $Nb_3Sn$, or gallium in the case of $V_3Ga$, are then applied to the matrix material. This is done, for example, when using tin by immersing the wire briefly into a tin melt so that a thin layer of tin is formed on the matrix material. Alternatively, it is done by evaporating a tin layer onto the matrix material. Thereafter a heat treatment is performed in which the elements of the compound to be produced which are applied to the outside of the matrix material diffuse into and through the latter and form the desired superconductive compound through reaction with the cores. Heat treatment can be carried out in one or more steps. For example, in a first step, the tin applied to the copper matrix diffuses into the matrix and during a second step the compound $Nb_3Sn$ is formed by reaction of the diffused-in tin with the niobium core. Processes of this nature are disclosed in "Applied Physics Letters" vol. 20, pages 443 to 445, (1972) and German Offenlegungsschrift No. 2,205,308.

Although these methods avoid the repeated annealing, they are not without difficulties and disadvantages. one disadvantage is that only relatively small amounts of tin, for example, can be applied to a matrix which consists of a material such as copper. If larger amounts of tin are applied to the copper matrix, then undesirable brittle intermediate phases of copper and tin are formed at the temperature required for the diffusion of tin or the conductor surface is attacked by the tin. As a result of this limitation, only a limited amount of tin is available for the formation of the intermetallic compound $Nb_3Sn$. At the temperatures required for the tin to diffuse into the copper matrix, the tin applied to the matrix surface also is at a temperature exceeding its melting point and can easily drip or run off from the matrix surface or at the very least distribute itself unevenly over the surface of the matrix. This can lead to large irregularities in the diffusion and subsequent formation of the Nb₃Sn layers. In addition, during heat treatment, care must be taken because of the tin which initially melts, to support the conductor in as opened a manner as possible, at least during the beginning of the heat treatment, in order that the melting tin layer does not touch other materials. Similar problems occur in the manufacture of conductors having other superconductor intermetallic compounds such as $V_3Ga$.

Thus, it can be seen that there is a need for an improved method of manufacturing conductors having superconductive intermetallic compounds which does not require repeated annealing during the cold drawing of the conductor for cross section-reducing but at the same time avoids the problems associated with applying a second element such as tin over the matrix after drawing. In particular, such a method should avoid having a melted element or compound on the outside during a heat treating process.

SUMMARY OF THE INVENTION

The present invention solves this problem by starting out with a process such as that described above, i.e., a process in which a core of one element is surrounded by a matrix of a material such as copper which does not contain the other elements and then performing cross section reducing. After the last crosssection reducing process step, a sheath of an alloy containing the remaining elements of the compound to be produced and a carrier metal is deposited on the jacket of the matrix material after which, the heat treatment for forming the compound is carried out.

In accordance with the present invention, metals suitable for matrix materials and carrier metals are those which do not react interferingly during heat treatment with the elements of the compound to be produced and whose alloys which are formed in the deposition and heat treatment from that metal and the remaining elements of the compound contained in the deposited sheath, have a melting point which is higher than the temperature at which the heat treatment is performed. Furthermore, the matrix material should be as ductile as possible so that they can easily be deformed to carry out cross section-reduction along with the cores consisting of a ductile element of the compound to be produced.

The method of the present invention has as one significant advantage, the fact that the matrix material along with the embedded core and cores can be easily deformed in a cross section-reducing process without intermediate annealing. Thus, a long fine wire having a diameter of, for example, about 5 to 20 $\mu$m can first be produced. After completion of cross section reducing to the desired diameter, the remaining elements of the compound are then diffused from the deposited alloy sheath into the matrix material and through the latter into the cores with all the advantages of solid diffusion. Since no melt is formed on the conductor surface during a heat treatment, the latter can be brought into contact with other materials without problems. For example, it can be placed in contact with guide rollers. Furthermore, in the deposited alloy, adequate quantities of the remaining elements of the compound to be produced can be made available and will have a uniform distribution for reaction with the cores. In accordance with the present invention, the deposition of the sheath of the alloy containing the remaining elements of the compound to be produced and the carrier metal can be deposited by electro-plating. When carried out in this fashion, the matrix material is not affected in any way.

It is preferred that the heat treatment be performed in two steps. During the first stage, the remaining elements of the compound in the sheath are diffused from the sheath into the matrix material. This is carried out at a lower temperature. During the second step which is carried out at a higher temperature, the compound is formed. Since the element of the compound contained in the sheath will normally reduce its melting point, with the melting point being lower, the higher the concentration of the elements, during the first step which is carried out at low temperature, the sheath will be in a state where its melting point is the lowest. However, after the first step, a large quantity of the elements will have diffused into the matrix and the melting point of the sheath will be correspondingly raised so that the final portion of the heat treatment can be carried out at the higher temperature.

The method of the present invention is particularly well suited for manufacturing a superconductor having superconductive intermetallic compounds consisting of two elements of the type $A_3B$ having an A-15 crystal structure. Preferably with manufacturing such compounds, the core enclosed by the matrix material will be the element having the higher melting point while the sheath deposited on the matrix material contains the element having the lower melting point. For use as a matrix material, the metals copper, silver and nickel or a ductile alloy of at least two of these materials is well suited. In similar fashion, the alloy which is deposited as a sheath can contain as a carrier metal, one of these metals, copper, silver, nickel or an alloy of at least two of the metals. A particularly homogeneous source for the other elements which are to be reacted with the core containing the one element of the compound during the first stage of heat treatment, if the matrix material is the same as the material of the carrier metal in the alloy forming the sheath.

The method of the present invention finds particular advantage in manufacturing the superconductor having the intermetallic compound $Nb_3Sn$. As disclosed, at least one niobium core is surrounded by a copper jacket after which cross section reducing is carried out. Thereupon a sheath of a copper tin alloy is electroplated onto the copper jacket. Copper tin alloys are particularly well suited for electroplating. In accordance with the preferred embodiment, a sheath of a copper tin alloy with 3 to 15 atom-percent and preferably about 12 atom-percent of tin and the rest copper, is deposited on the jacket. Copper tin alloys having less than 3 atom-percent of tin contain insufficient tin to form satisfactory $Nb_3Sn$ layers. Copper tin alloys having more than 15 atom-percent of tin can be used in principle so long as their melting point is still sufficiently high. However, alloys having a tin content this high, i.e., above 15 atom-percent, present a danger that undesirable brittle copper-tin phases will be formed during the heat treatment.

As disclosed, the copper tin alloys with 3 to 15 atom-percent of tin are caused to diffuse into the copper matrix during a first stage of heat treatment performed at a temperature of about 600°C for approximately 6 hours. The second step of the heat treatment is then carried out at a temperature of between 650° and 850°C and can last up to more than 100 hours.

As disclosed, it is particularly advantageous when manufacturing a multi-core conductor containing a large plurality of superconducting cores to first embed several cores of the one ductile element of a compound in a ductile matrix material and process the resulting structure to carry out cross section reduction. After the last cross section reduction step, the alloy sheath is deposited on the matrix containing the cores.

As noted above, the matrix containing one or more cores can be drawn down to a very fine wire which will still have an extremely small cross section after the alloy sheath is deposited on the matrix. Wires formed in this manner can then be used for forming a conductor with a larger cross section. In accordance with a method disclosed herein, a conductor in wire form is first produced by the cross section reducing process. Deposition of an alloy sheath containing the carrier metal and the remaining elements is then carried out after which a plurality of such wires are braided to form a conductor of larger cross section whereupon the conductor of larger cross section is then heat treated. The heat treatment in the formation of the relatively brittle intermetallic compound thus takes place after the braiding so that during the braiding itself, relatively small bending radii can be used without the possibility of damaging the superconductive compound. After finishing by heat treating the braided conductor still has sufficient flexibility despite the brittleness of the intermetallic compound and furthermore can carry a large total current.

To further increase the flexibility of the individual wires prior to braiding, it may be advantageous to perform, after deposition of the alloy sheath but prior to braiding, a short annealing treatment of several minutes to stress relieve the alloy sheath. During this annealing, the intermetallic compound which is to be produced must, of course, not be allowed to form.

Superconductors manufactured by a method according to the present invention are well suited for a-c applications or for applications with slowly varying currents such as for magnets operated by current pulses. The alloy remaining after heat treatment which consists of the matrix material or the carrier meterial and the remaining elements contained in the original alloy sheath surrounding the cores of the superconductive compounds formed has a relatively high electrical resistance at the operating temperature of the superconductors which is normally about 4 K so that eddy currents produced in the superconductor in the event of field changes are rapidly damped.

To provide electrical stabilization of the superconductor, a coating of electrically and thermally highly conductive metal which is electrically normally conducting at the operating temperature of the superconductor can be deposited perferably by electro-plating on the conductor surface after heat treatment.

Particularly, suitable metals are copper, silver and aluminum.

If the superconductor of the present invention is to be used in d-c applications or if less material with a higher electric resistance and more material with a lower electric resistance is desired in the conductor for other reasons, the remaining alloy after the final heat treatment can be at least partially dissolved and on the remaining conductor surface, a coating of electrically and thermally highly conductive metal deposited. To carry out this processing, the alloy can be chemically or electrochemically dissolved. Again, copper, silver and aluminum are well suited as metals for the coating which will preferably be deposited by electroplating.

DETAILED DESCRIPTION OF THE PREFERRED EMBODIMENT

Figure 1:
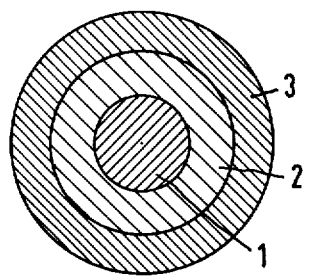
FIG. 1 is a cross sectional schematic view of a conductor structure manufactured according to the present invention prior to heat treatment.
Figure 2:
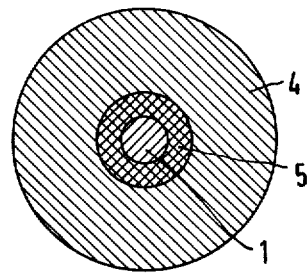
FIG. 2 is a similar view of the same conductor after final heat treatment.

FIG. 1 illustrates a cross sectional view of an arrangement according to the present invention for manufacturing a superconductor with the intermetallic compound $Nb_3Sn$ for example. In accordance with the present invention, a core 1 of niobium in wire form is surrounded by a tubular copper jacket 2. This can be carried out, for example, by inserting the niobium core 1 in wire form into a copper tube 2. The body obtained in this manner is then processed using suitable drawing or rolling passes without intermediate annealing into a long wire of reduced cross section. After the last cold-forming pass, the sheath 3 which is of a copper-tin alloy having tin in the range of 3 to 15 atom-percent tin and the rest copper and preferably with 12 atom-percent tin, is deposited on the jacket by electroplating. Preferably, prior to electroplating, the jacket 2 is cleaned for example, using warm hydrochloric acid. Thereafter, the wire comprising the core 1 and jacket 2 is placed in an electroplating bath suitable for depositing the desired copper-tin alloy. A particularly advantageous bath for this purpose consists of an aqueous solution of about 40 g/l of copper cyanide (CuCn), about 70 g/l of sodium stannate ($Na_2SnO_3$·3 $H_2O$), about 7.5 g/l of sodium hydroxide (NaOH) and about 65 g/l of sodium cyanide (NaCH). The cathodic current density at the wire, which is connected as the cathode, should be about 7.5 $A/dm^2$. A bath temperature of approximately 60°C is used. After the desired thickness of the copper-tin sheath 3 is deposited, the wire is removed from the bath, rinsed with water and then dried. Subsequently the wire is annealed at a temperature of approximately 600°C for several hours to cause the tin to diffuse from the copper-tin sheath into the copper jacket 2. As a result, an approximately uniform tin concentration comes about in the sheath 3 in the jacket 2. The copper-tin alloy sheath which then surrounds the niobium wire with the uniform tin concentration is designated as 4 on FIG. 2. The wire is then subjected to a heat treatment for forming the $Nb_3Sn$ layer. Preferably, this heat treatment will be carried out at a temperature of about 750°C and will last for approximately 60 hours. This results in the formation of an $Nb_3Sn$ layer 5 due to the reaction of the tin with the niobium wire 1. This layer 5 which is on the surface of the niobium wire 1 is shown on FIG. 2.

The extent to which the niobium wire 1 reacts with the tin to form $Nb_3Sn$ depends on the duration of the heat treatment along with the temperature used during such treatment. Other important factors are the diameter of the core 1 and the amount of tin available in the alloy sheath for surrounding the core. The finer the core 1 and the higher the tin content in the alloy sheath 4, the higher the probability that the entire core 1 completely reacts to form $Nb_3Sn$. Furthermore, the thickness of the reacted layer increases with the temperature used in the heat treatment and the duration of heat treatment. The exact reaction parameters can be easily determined experimentally in individual cases.

Figure 3:
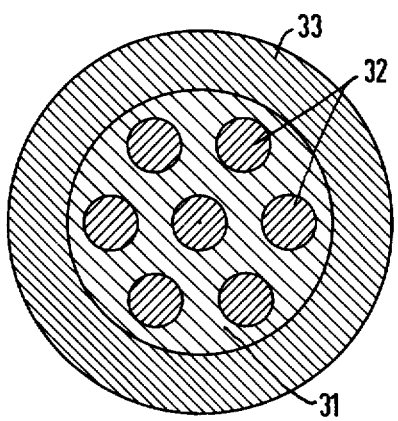
FIG. 3 is a schematic cross sectional view of a multi-core conductor embodiment prior to final heat treatment.
Figure 4:
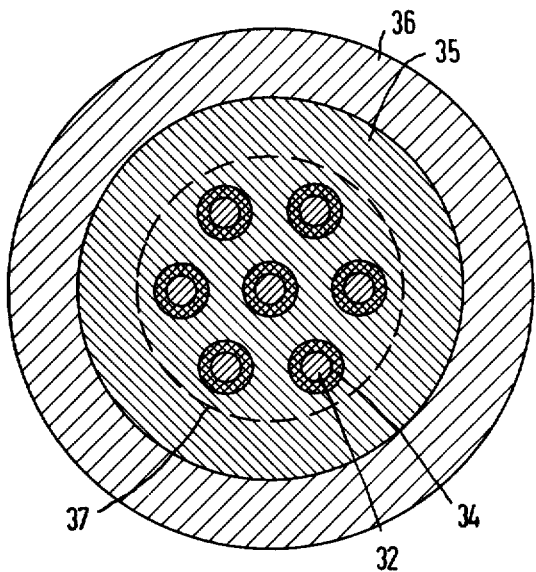
FIG. 4 is a similar view of the conductor of FIG. 3 after heat treatment, and also illustrates a layer of stabilizing metal on the conductor.

FIG. 3 illustrates a conductor structure including a plurality of niobium cores 32 in wire form within a copper matrix 32. A structure of this nature can be made by providing a copper bar with a plurality of holes and placing niobium wires in the holes. In accordance with the present invention, a structure of this nature is then processed to obtain cross section reduction using cold drawing, for example. Another possible manner of forming such a conductor is to first provide individual niobium wires with copper jackets and then to combine a number of such structures into a bundle, and then place this bundle in a copper tube of larger cross section. The wires and the copper tube are then cold drawn to form a long wire of reduced cross section. In either case, after the last cold drawing pass, a copper tin sheath 33 is then deposited on the copper matrix 31. Deposition and further treatment is carried out in the manner described above in connection with FIGS. 1 and 2. The conductor obtained after the final heat treatment is illustrated in FIG. 4. $Nb_3Sn$ layers are produced at the surface of the niobium cores and are designated as 34. The cores with these layers are enclosed by a copper-tin matrix 35 having an approximately uniform tin concentration. In accordance with a further feature of the present invention, a silver layer 36 is placed on the matrix 35 to provide electrical stabilization. The silver layer 36 can be deposited on the surface of the matrix 35 using a conventional electroplating bath.

If for electrical reasons less copper-tin alloy is desired in the finished conductor, a portion of the copper-tin alloy can be removed. Removal down to the level indicated by the dotted line 37 on FIG. 4 is possible. Such removal can be carried out chemically by immersing the wire, for example in a solution of equal volume parts of concentrated nitric acid and water. It is also possible to remove the matrix material electrochemically. After removal of the desired amount of matrix material, the stabilization material, e.g. silver can then be deposited on the conductor which now has a reduced diameter.

EXAMPLE

A superconductor of the type shown on FIGS. 3 and 4 was fabricated by first making a single core conductor consisting of a niobium wire and copper jacket. Nineteen single-core conductors of this type were then placed in a copper tube. The structure so obtained was then cold-drawn a plurality of times until a conductor of the form shown in FIG. 3 was obtained. In this structure, the individual niobium cores 32 had a diameter of about 15 $\mu$m and the copper matrix 31 a diameter of about 150 $\mu$m. The surface of the copper matrix 31 was cleaned in warm hydrochloric acid and then a sheath 33 approximately 40 $\mu$m thick of a copper-tin alloy having about 12 atom-percent of tin was electrodeposited on the surface of the matrix 31, using the electroplating method disclosed above in connection with FIG. 1. To improve the flexibility of the deposited alloy sheath, the wire was then annealed for stress relief for about 5 minutes at a temperature of between 600° and 650°C. After annealing, the wire was easily bent with bending radii of even less than 3 mm. Several such wires were then braided to then form a litz-type conductor such as that shown schematically on FIG. 5.

Figure 5:
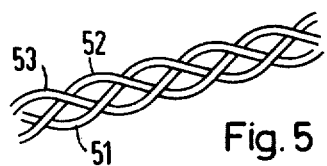
FIG. 5 is a schematic perspective view illustrating the braiding of a plurality of conductors according to the present invention in order to form a conductor of larger cross section.

On the conductor shown on FIG. 5, only three wires designated 51, 52 and 53 are illustrated for sake of clarity. A conductor of this nature is particularly well suited for applications involving a-c current or slowly varying currents because of the frequent transposition of the individual superconducting filaments. The niobium cores 32 may furthermore be arranged to advantage on helical paths within the copper matrix 31. This is accomplished by twisting the wire consisting of the matrix 31 and the cores 32 about its longitudinal axis during manufacture.

To finish the litz-type conductor shown on FIG. 5, the mutually braided wires were then subjected to a homogenizing anneal lasting about 6 hours at a temperature of about 600°C. This equalizes the tin concentration within the copper tin sheath 33 and the copper matrix 31. Subsequently, the conductor was annealed for about 100 hours at a temperature of about 750°C. The thickness of the $Nb_3Sn$ layer 34 formed in this process, i.e., that at the surface of the individual niobium wires 32, was about 6 $\mu$m. With a braided conductor fabricated in this manner, an effective critical current density of about $5 \times 10^4$ A/cm$^2$ referred to the entire conductor cross section including the matrix material was obtained operating at a temperature of about 4.2 K and in an external magnetic field of about 5 Teslas.

Braid conductors made in this manner which can preferably be in the form of ribbons can be easily bent even after formation of the $Nb_3Sn$ layers. There is no trouble bending down to the bending radii which are required for winding superconductor coils. In addition to the high flexibility available, such braided conductors have a large conductor cross section due to the large number of wires that can be braided together and thus large effective currents are possible. In addition, the conductor has a further advantage in that the individual superconducting filiments have very small cross sections. If desired, a stabilizing layer can be further applied on top of the braided conductor for example, by electrodepositing silver thereon. The external shape of the braided conductors is not limited to ribbon form. Individual wires can also be braided together to form a tubular conductor.

For manufacturing a conductor having the compound $Nb_3Sn$, a silver-tin alloy can also advantageously be deposited on the matrix material rather than the copper-tin alloy. A suitable bath for furnishing a silver-tin alloy with about 10% by weight of tin consists of an aqueous solution of about 5 g/l of silver cyanide (AgCN), about 80 g/l of potassium stannate ($K_2SnO_3.3 H_2O$), about 50 g/l of sodium hydroxide (NaOH) and about 80 g/l of sodium cyanide (NaCN). The deposition takes place here advantageously with a current density of about 0.2 A/dm$^2$ at a bath temperature of about 50°C.

An noted above, the method of the present invention may also be used for the manufacture of $V_3Ga$ superconductors and other similar superconductors. When manufacturing a $V_3Ga$ superconductor the alloy sheath can contain for example about 5 to 30 atom-percent and preferably up to 18 atom-percent of gallium with the remainder copper. Heat treatment of the $V_3Ga$ layers takes place preferably at temperatures between 500° and 950°C. In selecting the temperature, care must be taken that the sheath made of the copper gallium alloy does not melt.

The cores of at least one ductile component of the compound to be produced which are embedded in the matrix need not necessarily consist of a single metal but may optionally contain additives. For example, titanium, zirconium or tantalum in amounts of up to 30% by weight can be mixed to the niobium or vanadium. In addition, several elements may be present in the alloy sheath to form an intermetallic compound with the core. For example, tin and gallium may both be present therein.

If it is desired to deposit an alloy combination which is difficult to electroplate, the deposition of the sheath surrounding the matrix material can be carried out in some other manner. For example, it may be done from the gaseous phase through decomposition of gaseous compounds containing the individual alloy components at the wire surface thermally or through reduction by means of hydrogen. However, electroplating is preferred because of the ease with which it is carried out. Depositing the alloy sheath on the surface of the matrix material is particularly advantageous in establishing a good bond between the sheath and the matrix material during the deposition. This eliminates an undesirable cross section-reducing deformation of the alloy sheath which can be necessary to establish a firm bond between the matrix material and the alloy sheath if the sheath is made or produced in some other manner. For example, if the sheath were formed as a tube of a copper-tin alloy in which the wire consisting of the cores in the copper matrix were placed such deformation would be necessary to obtain the necessary bonding.

Thus, an improved process for making a superconductor having a superconductor intermetallic compound consisting of at least two elements has been described. Although specific methods have been illustrated and described, it will be obvious to those skilled in the art that various modifications may be made without departing from the spirit of the invention which is intended to be limited solely by the appended claims.

What is claimed is:

1. The method of manufacturing a superconductor having a superconductive intermetallic compound consisting of at least two elements comprising the steps of:
   a. surrounding a core of at least one ductile element of the compound with a jacket of a ductile matrix material;
   b. subjecting the core surrounded by the jacket to a cross section reducing process to form a wire of reduced cross section;
   c. applying to the surface of the wire of reduced cross section a sheath consisting of an alloy containing the remaining elements of the compound to be produced and a carrier metal;
   d. heat treating the wire and sheath to result in a diffusion of the remaining elements into the matrix and to cause a reaction of the remaining elements wth the core element to form the intermetallic compound.

2. The method according to claim 1 wherein said sheath of alloy is deposited by electroplating.
3. The method according to claim 1 wherein said heat treatment is performed in two steps comprising:
   a. a first step at a lower temperature to cause diffusion of the remaining elements of the compound from the sheath into the matrix material; and
   b. a second step at a higher temperature to cause reaction of the remaining elements and the core element to form the intermetallic compound.
4. The method according to claim 1 wherein the superconductive compound is an intermetallic compound consisting of two elements of the type $A_3B$ having an A-15 crystal structure and wherein the core consists of the element of the compound having a higher melting point with the element having the lower melting point being in the sheath alloy.
5. The method according to claim 1 wherein the matrix material is one of the group consisting of copper, nickel, and a ductile alloy of at least two of the group consisting of copper, silver and nickel.
6. The method according to claim 1 wherein the alloy deposited on the sheath contains as a carrier metal one of the group consisting of copper, silver, nickel and an alloy of at least two of the group consisting of copper, silver and nickel.
7. The method according to claim 1 wherein the matrix material and the carrier metal are the same metal.
8. The method according to claim 1 wherein the intermetallic compound is $Nb_3Sn$.
9. The method according to claim 8 wherein said core is niobium, said matrix jacket is copper and said sheath is a copper tin alloy.
10. The method according to claim 9 wherein said sheath contains 3 to 15 atom-percent tin and the remainder copper.
11. The method according to claim 9 wherein said sheath contains 12 atom-percent of tin.
12. The method according to claim 1 and further including the step of surrounding a plurality of cores of at least one ductile element of the compound with a ductile matrix material prior to said cross section reducing step.
13. The method according to claim 1 and further including the step of braiding a plurality of said wires of reduced cross section after deposition of said alloy sheath but before heat treatment.
14. The method according to claim 13 and further including the step of annealing said wires after deposition of said alloy but before braiding, said annealing being carried out at a temperature sufficiently low to prevent formation of said intermetallic compound.
15. The method according to claim 1 and further including the step of depositing a coating of electrically and thermally highly conductive metal which is electrically normally conducting at the operating temperature of the superconductor on the surface of the conductor after heat treatment.
16. The method according to claim 15 and further including the step of dissolving at least a portion of the sheath and matrix material surrounding said core after heat treatment, but prior to deposition of said electrically and thermally highly conductive metal.
17. The method according to claim 16 wherein said coating is one of the group consisting of copper, silver and aluminum.

* * * * *